United States Patent
Liang et al.

(10) Patent No.: US 8,816,382 B2
(45) Date of Patent: Aug. 26, 2014

(54) SEMICONDUCTOR LIGHT-EMITTING ELEMENT

(71) Applicant: Stanley Electric Co., Ltd., Tokyo (JP)

(72) Inventors: Ji-Hao Liang, Kawasaki (JP); Ryosuke Kawai, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/718,000

(22) Filed: Dec. 18, 2012

(65) Prior Publication Data

US 2013/0161682 A1   Jun. 27, 2013

(30) Foreign Application Priority Data

Dec. 21, 2011   (JP) ................................ 2011-279770

(51) Int. Cl.
*H01L 33/00*   (2010.01)
*H01L 27/15*   (2006.01)
*H01L 29/26*   (2006.01)
*H01L 31/12*   (2006.01)
*H01L 29/267*   (2006.01)
*H01L 29/16*   (2006.01)

(52) U.S. Cl.
USPC ............... 257/99; 257/79; 257/80; 257/81; 257/82; 438/26

(58) Field of Classification Search
None
See application file for complete search history.

(56) References Cited

U.S. PATENT DOCUMENTS

| 2009/0159902 A1* | 6/2009 | Yasuda et al. .................. 257/88 |
| 2009/0212307 A1 | 8/2009 | Baur et al. |
| 2011/0215363 A1* | 9/2011 | Kimura et al. .................. 257/99 |

FOREIGN PATENT DOCUMENTS

| JP | 5-145119 A | 6/1993 |
| JP | 2008-543068 A | 11/2008 |

OTHER PUBLICATIONS

Wang et al., Low-resistance Ti/Al/Ti/Au multilayer ohmic contact to n-GaN, Jun. 1, 2001, Journal of Applied Physics, vol. 89, No. 11, pp. 6214-6217.*
Wang et al., "Low-resistance Ti/Al/Ti/Au multilayer ohmic ti n-GaN", Journal of Applied Physis 89, 6214 (2001), pp. 6214-6217.*

* cited by examiner

*Primary Examiner* — Steven Loke
*Assistant Examiner* — Juanita B Rhodes
(74) *Attorney, Agent, or Firm* — Holtz, Holtz, Goodman & Chick PC

(57) ABSTRACT

There is provided a semiconductor light-emitting element which has an electrode structural body including a connection electrode and a wiring electrode connected to the connection electrode, the wiring electrode stretching along a surface of a semiconductor layered body while being in partial contact with the surface of the semiconductor layered body exposed from an opening formed on the insulation layer. The area of a contact region between the wiring electrode and the semiconductor layered body increases, from a connection end which is connected to the connection electrode, along a direction in which the wiring electrode stretches.

8 Claims, 12 Drawing Sheets

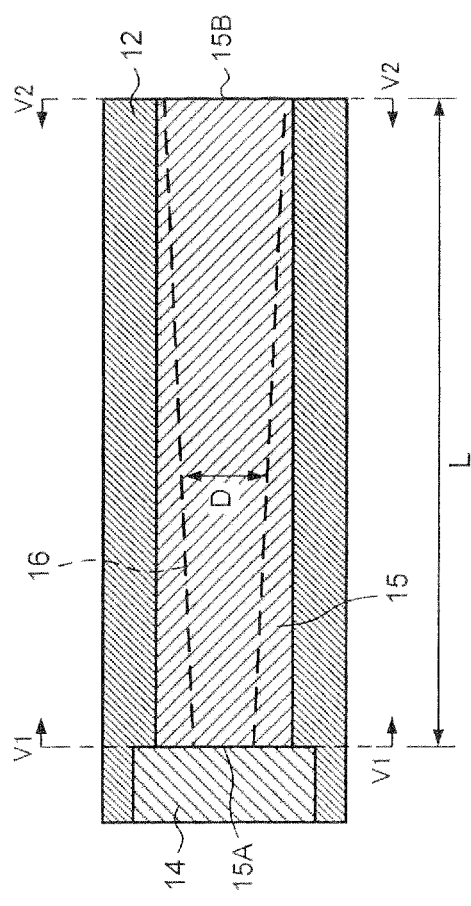
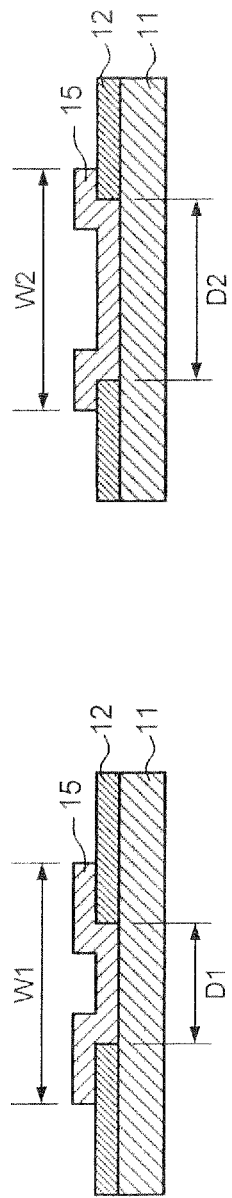
FIG.1A
FIG.1B
FIG.1C

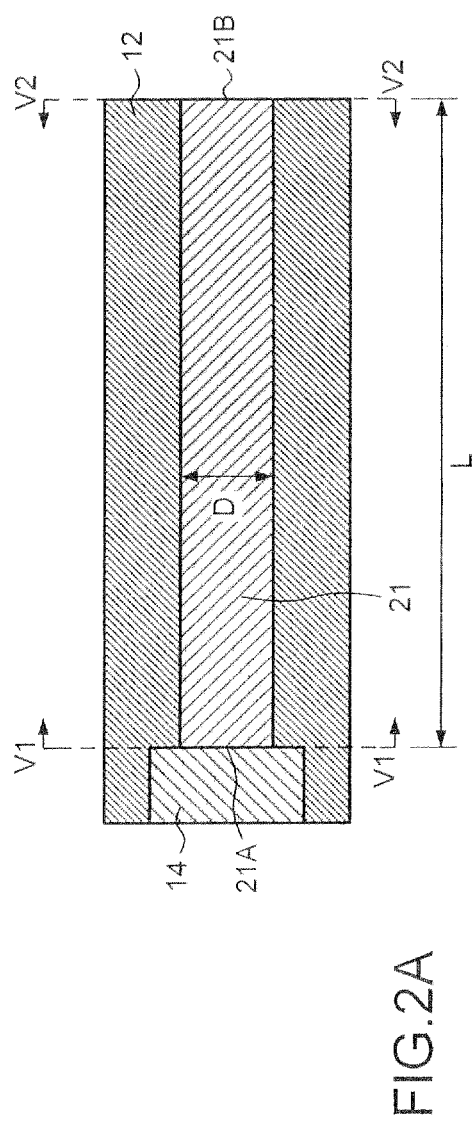
FIG.2A
FIG.2B
FIG.2C

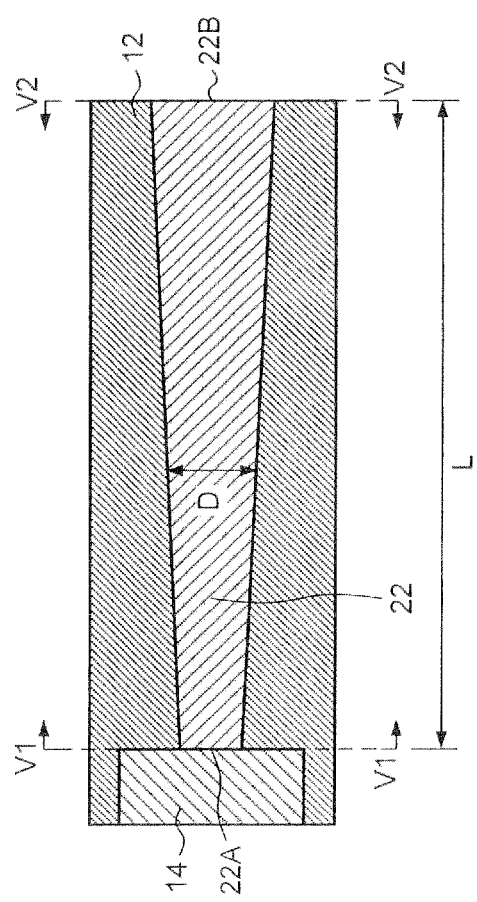
FIG.3A
FIG.3B
FIG.3C

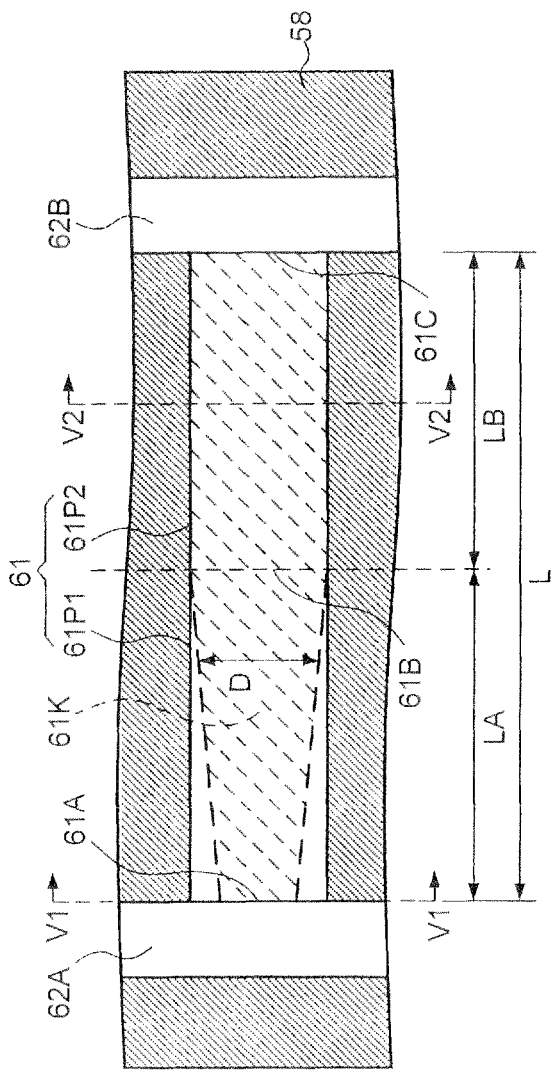
FIG.10A
FIG.10B
FIG.10C

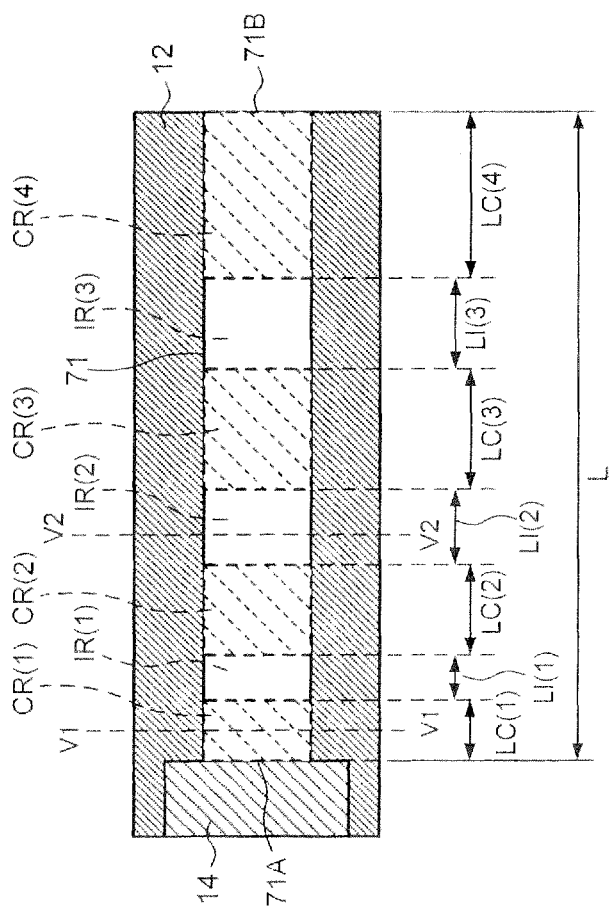
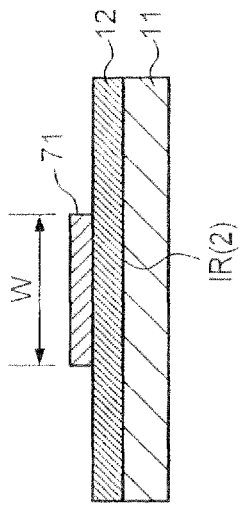
FIG.13A
FIG.13B
FIG.13C

US 8,816,382 B2

SEMICONDUCTOR LIGHT-EMITTING ELEMENT

BACKGROUND OF THE INVENTION

1. Field of the Invention

The present invention relates to a light-emitting element, and in particular to a semiconductor light-emitting element such as a light-emitting diode (LED).

2. Description of the Related Art

Conventionally, in a semiconductor light-emitting element such as a light-emitting diode (LED), a pad electrode or another connection electrode is provided on the semiconductor layer (or a contact layer) on the surface of the element. Supply current from the exterior is injected into the semiconductor light-emitting element through the connection electrode and the light-emitting element is caused to emit light. There is used a configuration in which a wiring electrode connected to the connection electrode is provided on the contact layer, and a current is injected into the semiconductor light-emitting element.

In an LED in which the surface of the semiconductor light-emitting element is the light-extraction surface, it is important chat a current flows uniformly in the plane of the semiconductor layer. In particular, in recent years, there have been efforts to increase the area of LEDs due to demands such as those for increased brightness or light emission efficiency of LEDs. Also, so-called thin-film LCDs nave been fabricated. These thin-film LEDs are formed by growing a semiconductor layer comprising, e.g., a GaN-based compound semiconductor on a sapphire or another growth substrate and subsequently separating the growth layer from the substrate. In an LED of such description, it is important in terms of obtaining a high-performance element to prevent current crowding or concentration in the plane of the semiconductor layer and obtain a uniform current distribution.

For example, Japanese Unexamined Patent Application Publication No. 2008-543068 ("Patent Reference 1" hereafter) discloses an LED in which the width of the wiring electrode becomes smaller (the wiring electrode becomes thinner) as the distance from a bonding pad increases. Also, Japanese Unexamined Patent Application Publication No. H05-145119 ("Patent Reference 2" hereafter) discloses an LED having a wiring electrode comprising a plurality of orders of branches extending as lines from a pad section.

SUMMARY OF THE INVENTION

However, in a conventional light-emitting device such as that described above, if the wiring electrode is gradually made thinner as described in Patent Reference 1, the wiring resistance increases, causing a rise in element-driving voltage. Also, injection of a large current results in heat being generated in the portion at which the wiring electrode is thinner, causing a break in the wiring electrode itself. In addition, making the wiring electrode thinner makes patterning process more difficult and causes peeling of the electrode. Also, in an electrode structure such as that described in Patent Reference 2, the branching of the wiring electrodes results in a more complex pattern and makes patterning process more difficult. Furthermore, emitted light is blocked by a degree; corresponding to the increase in the wiring electrodes, causing a decrease of emission intensity.

The present invention was conceived in light of the above-mentioned points, and an object of the present invention is to provide a semiconductor light-emitting element in which the problems presented, by conventional light-emitting elements are resolved, current crowding or concentration and an increase in element-driving voltage are prevented, and current can be spread and injected in a light-emitting layer in a uniform manner; and in which the semiconductor light-emitting element has a high brightness and a high light emission efficiency.

According to the present invention, there is provided a semiconductor light-emitting element comprising a semiconductor layered body including a light-emitting layer; an insulation layer provided on a light extraction surface of the semiconductor layered body; and an electrode structural body provided, on the insulation layer;

wherein the electrode structural body includes:

a connection electrode for receiving a current supply from the exterior; and a wiring electrode connected to the connection electrode, the wiring electrode stretching along a surface of the semiconductor layered body while being in partial contact with the surface of the semiconductor layered body exposed from an opening formed on the insulation layer;

wherein the area of a contact region between the wiring electrode and the semiconductor layered body increases, from a connection end which is connected to the connection electrode, along a direction in which the wiring electrode stretches.

BRIEF DESCRIPTION OF THE DRAWINGS

FIGS. 1A, 1B, and 1C are a top view schematically illustrating an electrode structure E1 according to a first embodiment of the invention and cross-section views schematically illustrating cross-sections along lines V1-V1 and V2-V2 in FIG. 1A;

FIG. 2A is a top view schematically illustrating an electrode structure C1 of a comparative example 1, and FIGS. 2B and 2C are cross-section views;

FIG. 3A is a top view schematically illustrating an electrode structure C2 of a comparative example 2, and FIGS. 3B and 3C are cross-section views;

FIG. 10A is a plan view illustrating the portion of FIG. 9A corresponding to a first wiring electrode 61 (region P2), and FIGS. 10B and 10C are cross-section views;

FIG. 13A is a top view schematically illustrating an electrode structure E3 representing an example of a wiring electrode configured so that the contact, area increases in an equivalent manner, and FIGS. 13B and 13C are cross-section views.

DETAILED DESCRIPTION OF THE INVENTION

Figure 4A:
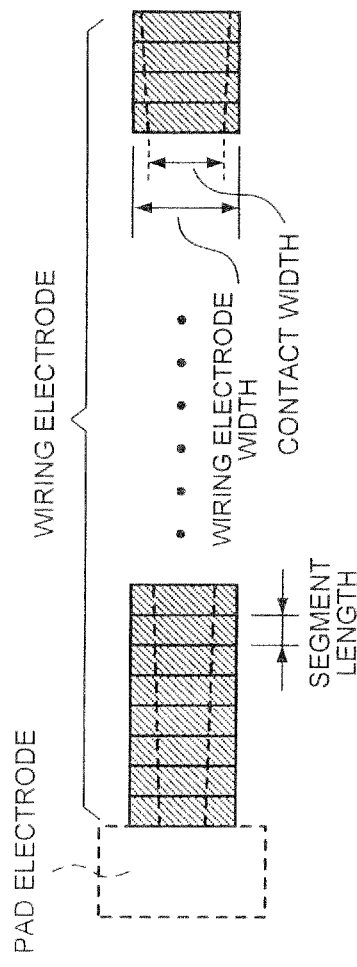
FIGS. 4A and 4B schematically illustrate a simulation model and an equivalent circuit, respectively.

Preferred embodiments of the present invention will now be described; the embodiments can be modified and combined as appropriate. In the drawings referred to below, portions that are substantively identical or equivalent are described affixed with identical numerals.

First Embodiment

FIG. 1A is a too view schematically illustrating the basic electrode structure (hereafter also referred to as "electrode structure E1") according to a first embodiment of the invention; and FIGS. 1B and 1C are cross-section views schematically illustrating the cross-section along line V1-V1 and V2-V2 of FIG. 1A respectively. In detail, an insulation layer 12 is formed on a semiconductor layer 11. A pad electrode 14, which is a connection electrode connected by a bonding wire or a similar element to an external circuit and which receives supply of a current, is formed on the insulation layer 12. A wiring electrode 15, electrically connected to the pad electrode 14, is also formed. The wiring electrode 15 stretches or extends on the insulation layer 12 along the surface of the semiconductor layer 11 from the connection portion at which a connection is established with the pad electrode 14, and has a width W1 at the connection portion and a width W2 at a terminal end portion (distal end portion). The description below is given for an example in which the width of the wiring electrode 15 is uniform or constant (i.e., W1=W2=W). However, the width of the wiring electrode 15 may change, e.g., in a linear manner, from the connection portion with the pad electrode 14 to the terminal end portion. The width of the wiring electrode, and the width of a contact region described further below are defined as the width along a direction perpendicular to the direction of stretching or extension of the wiring electrode.

In FIG. 1A, a contact region 16 between the wiring electrode 15 and the semiconductor layer 11 is indicated by dashed lines. Specifically, the wiring electrode 15, at a connection end portion 15A which is a connection portion with the pad electrode 14, is in contact with the semiconductor layer 11 by a width D1 that is smaller than the width W of the wiring electrode 15 (D1<W); and at a terminal end portion 15B, is in contact with the semiconductor layer 11 by a width D2 (D2<W or D2=W). The width D of the contact region 16 increases linearly from the connection end portion 15A to the terminal end portion 15B towards the direction along which the wiring electrode 15 is stretched (or longitudinal direction). More specifically, the insulation layer 12 is provided with an opening (width=D) having a width D that increases linearly along the stretching direction from D1 to D2 from the connection end portion 15A that is a connection portion with the pad electrode 14 to the terminal end portion 15B; and the wiring electrode 15 is in contact (i.e., Ohmic contact) with the semiconductor layer 11 exposed from the opening. Also, as shown, e.g., in FIG. 1B, with regards to the wiring electrode 15, the region outside the contact region 16 is a non-contact region formed so that both sides thereof are mounting the insulation layer 12. Specifically, the wiring electrode 15 stretches along the surface of the semiconductor layer 11, with a portion of the wiring electrode 15 in partial contact with the surface of the semiconductor layer 11 exposed from the opening formed in the insulation layer 11.

FIG. 2A is a top view schematically illustrating the electrode structure of a comparative example 1 (hereafter also referred to as "electrode structure C1"), used as a comparison with the electrode structure E1 of the first embodiment. FIGS. 2B and 2C are cross-section views schematically illustrating the cross-section along line V1-V1 and line V2-V2 in FIG. 2A, respectively. Similarly, FIG. 3A is a top view schematically illustrating the electrode structure of a comparative example 2 (hereafter also referred to as "electrode structure C2"), used as a comparison with the electrode structure E1 of the first embodiment. FIGS. 3B and 3C are cross-section views schematically illustrating the cross-section along line V1-V1 and line V2-V2 in FIG. 3A, respectively.

In the electrode structure C1 of the comparative example 1, the wiring electrode 21 has a uniform or constant width W11 from the connection end portion 21A that is the connection portion with the pad electrode 14 to the terminal end portion 21B. Also, the wiring electrode 21 is in contact with the semiconductor layer 11 in its entire region (i.e., along its entire length) from the connection end portion 21A to the terminal end portion 21B as shown in FIGS. 2B, 2C (i.e., contact width D=W11), and does not have a non-contact region. Specifically, the insulation layer 12 is provided with an opening having a uniform width W11, in the direction in which the wiring electrode 21 is stretched, from the connection end portion 21A that is the connection portion with the pad electrode 14 to the terminal end portion 21B; and the entire region of the wiring electrode 21 are in contact with the semiconductor layer 11 exposed from the opening.

In the electrode structure of the comparative example 2 (hereafter also referred to as "electrode structure C2"), the width of the wiring electrode 22 increases linearly from W21 to W22, in the direction of stretching, from the connection end portion 22A that is the connection portion with the pad electrode 14 to the terminal end portion 22B. Also, as shown in FIGS. 3B and 3C, the wiring electrode 22 is in contact with the semiconductor layer 11 in its entire region (i.e., along its entire length) from the connection end portion 22A to the terminal end portion 22B, and does not have a non-contact region. In other words, the contact width D also increases linearly from W21 at the connection end portion 22A to W22 at the connection end portion 22B. Specifically, the insulation layer 12 is provided with an opening having a width that increases in a linear manner from W21 to W22, along the direction in which the wiring electrode 22 is stretched, from the connection end portion 22A that is the connection portion with the pad electrode 14 to the terminal end portion 22B; and the wiring electrode 22 is in contact with the semiconductor layer 11 exposed from the opening.

[Simulation]
1. Simulation Model

Figure 4B:
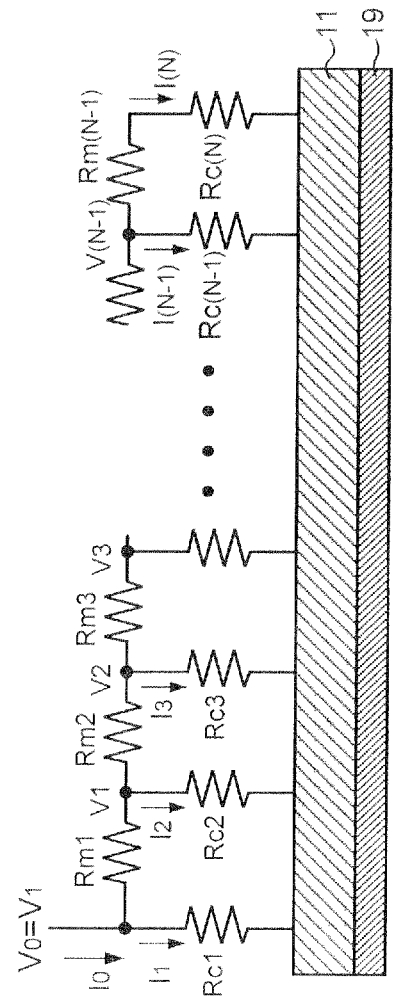

A simulation of current distribution was performed on the above-mentioned electrode structure E1 according to the first embodiment and the electrode configurations C1, C2 of the comparative examples 1 and 2. FIGS. 4A and B schematically illustrate a simulation model used in the simulations and an equivalent circuit. As shown in FIG. 4A, the wiring electrode is divided or segmented N times (here, N=100) along the direction of stretching (i.e., the direction from the end portion which is a connection portion with the pad electrode towards the terminal end portion); and as shown in FIG. 4B, the current flowing in the wiring electrode at each position of segmentation, and the current flowing in a wiring electrode branching from the aforementioned wiring electrode, are calculated. It is thereby possible to calculate the current flowing in the semiconductor at each position of segmentation, and to obtain the current distribution along the direction in which the wiring electrode is stretched.

In the equivalent circuit shown in FIG. 4B, Rc(j) represents the resistance between metal and semiconductor (j=1, 2, ..., N), Rm(k) represents the wiring resistance (k=1, 2, ..., N−1), V0 represents the voltage applied on the pad electrode 14, and I0 represents the current injected from the pad electrode 14. The resistance Rc between metal and semiconductor can be obtained as follows from the contact resistance between metal and semiconductor: specifically, Rc=contact resistance/(width of line of contact: of wiring electrode with respect to semi conductor×segment length). Meanwhile, the wiring resistance Rm can be represented by Rm=resistivity×segment length/(thickness of wiring electrode×width of wiring electrode). Each of the resistance values is obtained, and the current flowing through the entire wiring electrode is defined, whereby the current value and the voltage value at each position can be obtained from Ohm's law. This method is used to obtain the current flowing in the semiconductor at each position, whereby the current distribution is calculated. A difference between the maximum and minimum current values for the wiring electrode is obtained, and the difference with respect to the maximum, value when the maximum value is defined as 100% is defined as the current non-uniformity degree. For example, reducing the current non-uniformity degree to 10% or less will be set as an objective (i.e., uniform current distribution).

The simulation was performed assuming that the resistivity of the wiring electrode is $2\times10^{-8}\Omega$, the injected current IO=350 mA, the thickness of the wiring electrode is 3 μm, and the length L of the wiring electrode is 750 μm; and using the contact resistance as a parameter. A value identical to the resistivity of the wiring electrode was also used for a second electrode 19 connected to the entire reverse surface of the semiconductor layer 11 (opposite polarity with respect to the wiring electrode). In FIGS. 1A-1C to FIGS. 3A-3C (i.e., electrode structure E1, electrode configurations C1, C2), the reverse-surface electrode is not shown.

2. Simulation Results 2.1 Electrode Structure of Comparative Example 1 (C1)

Figure 5:
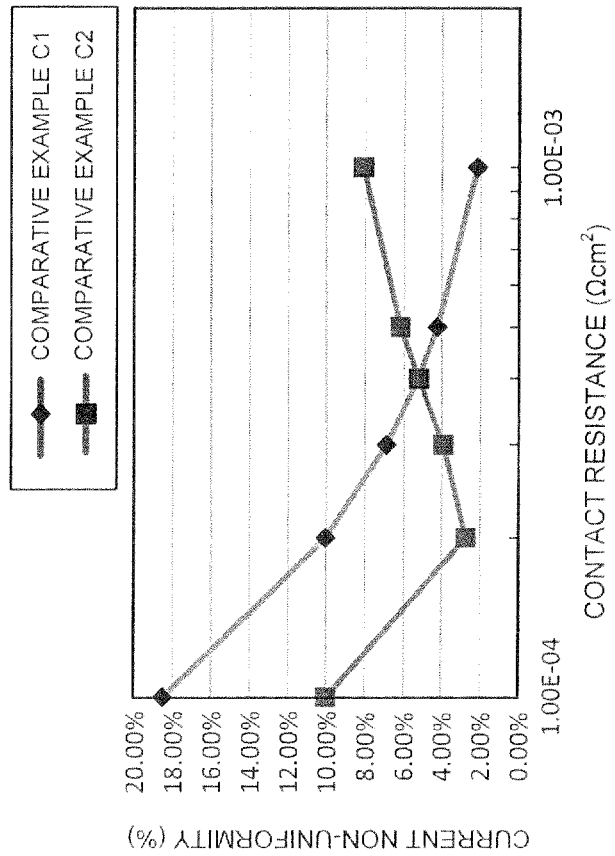
FIG. 5 shows results of simulations performed on the electrode structure C1 of the comparative example 1 and the electrode structure C2 of the comparative example 2.

In the electrode structure C1 of the comparative example 1, the wiring electrode 21 has a uniform or constant width W11 as described above. Simulation results in an instance in which the width W11 of the wiring electrode 21 is taken to be 10 μm are shown in FIG. 5. The vertical axis represents current non-uniformity (%). With regards to the current non-uniformity, a difference between the maximum and minimum current values for the wiring electrode is obtained, and the divergence from the maximum value when the maximum value is defined as 100% is defined as the current non-uniformity (%). The horizontal axis represents the contact resistance between the semiconductor and the wiring electrode. It can be seen that the current non-uniformity is kept to 10% or less and that the current flows in a uniform manner when the contact resistance is equal to or greater than $2\times10^{-4}$ $\Omega cm^2$ (hereafter, may be expressed as an index as 2E-4 $\Omega cm^2$). However, in the electrode structure C1 of the comparative example, there is a disadvantage in that the driving voltage is higher, since the contact resistance is high.

2.2 Electrode Structure of Comparative Example 2 (C2)

In the electrode structure C2 of the comparative example 2, as described above, the width of the miring electrode 22 increases from W21 so W22 linearly in the longitudinal direction, from the connection end portion 22A which is a connection portion with the pad electrode 14 to the terminal end portion 22B; and the entire region of the wiring electrode 22 ore in contact with the semiconductor layer 11, it can be seen that in the electrode structure C1, current non-uniformity cannot be suppressed when the contact resistance is $2\times10^{-4}$ $\Omega cm^2$. The electrode structure C2 is a structure in which the width, of the portion, of the wiring electrode branching from the bending pad, at which the current concentrates is reduced, whereby the wiring resistance at this portion is increased and current is caused to flow in a uniform manner. The simulation was performed taking the width W21 of the wiring electrode 22 in the connection end portion 22A to be 9 μm and the width W22 of the wiring electrode 22 at the terminal end portion 22R to be 10 μm.

As shown in FIG. 5, it can be seen that even if the contact resistance is $1\times10^{-4}$ $\Omega cm^2$ or less, the current non-uniformity can be kept to 10% or below. It can also be seen that in an instance in which the contact resistance is $4\times10^{-4}$ $\Omega cm^2$ or less, current non-uniformity is smaller than that of the electrode structure C1. Therefore, it can be seen that, the electrode structure C2 is effective m an instance in which the current resistance is equal to or less than $4\times10^{-4}$ $\Omega cm^2$.

Figure 6:
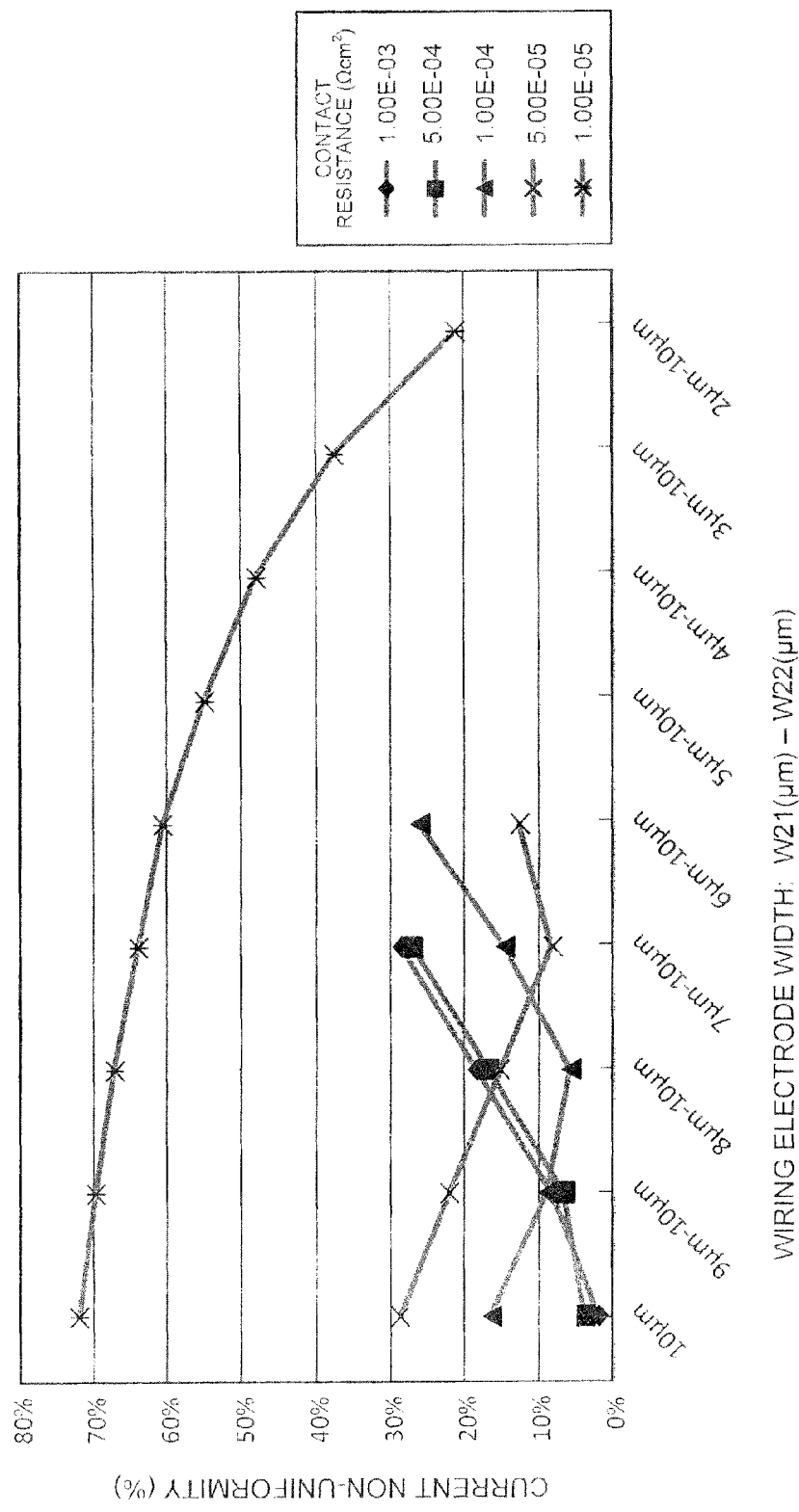
FIG. 6 shows results of simulations performed on the electrode structure C2 of the comparative example 2 in an instance in which the contact resistance is lower.

Next, FIG. 6 shows results in which simulations were performed on the electrode structure C2 of the wiring electrode where the contact resistance is even lower. The vertical axis represents current non-uniformity (%), as with the instance of FIG. 5. For the horizontal axis, the width W21 of the connection end portion 22A, and the width W22 of the terminal end portion 22B, of the wiring electrode 22 are denoted in the format "W21-W22." The simulation results are for instances in which the contact resistance is $1\times10^{-3}$, $5\times10^{-4}$, $1\times10^{-4}$, $5\times10^{-5}$, and $1\times10^{-5}$ $\Omega cm^2$.

When the contact resistance is $1\times10^{-4}$ $\Omega cm^2$, the current non-uniformity is the smallest (i.e., current uniformity is high) when she widths of the connection end portion 22A and the terminal end portion 22B (W21-W22) are 8 μm-10 μm. When the contact resistance is $5\times10^{-5}$ $\Omega cm^2$, the current non-uniformity is the smallest for the structure corresponding to 7 μm-10 μm. When the contact resistance is $1\times10$ $\Omega cm^2$, although the current non-uniformity cannot be suppressed to 10% or less, it can be seen that reducing (or narrowing) the width W21 of the wiring electrode between the connection end portion 22A which is the connection portion with the pad electrode 14 mitigates current non-uniformity. However, a problem is presented in that excessively narrowing the wiring electrode width results in the current crowding or concentration and the wiring electrode breaking, or the patterning process to form the wiring becoming more difficult. A problem is also presented in that narrowing the wiring electrode itself increases wiring resistance and raises the driving voltage.

2.3 Electrode Structure According to First Embodiment (E1)

Figure 7:
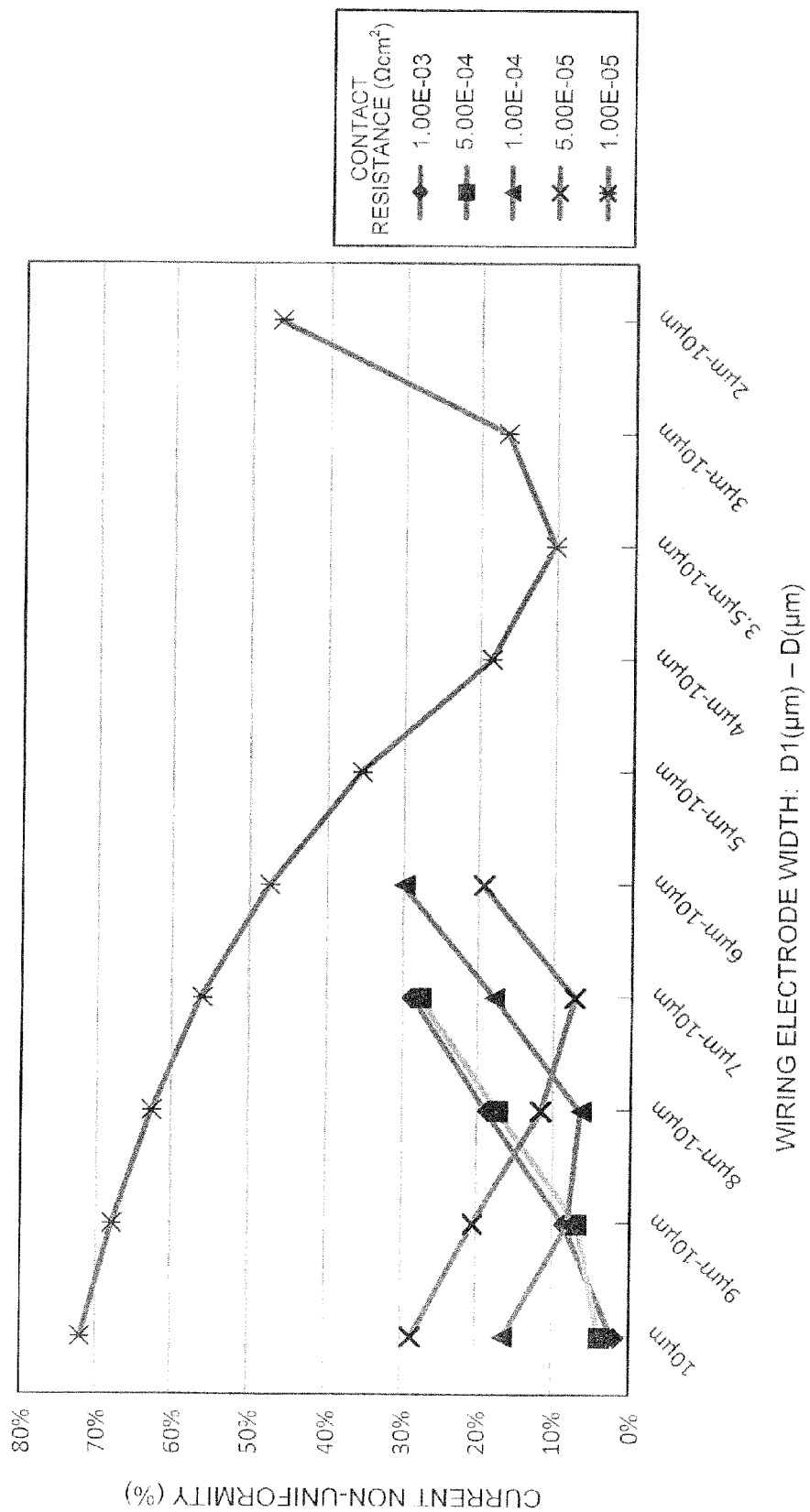
FIG. 7 shows results of simulations performed on the electrode structure E1 according to the first embodiment.

The electrode structure E1 according to the first embodiment is a structure in which ten insulation layer 12 is utilized, and the contact area between the wiring electrode 15 and the semiconductor layer 11 is reduced in the connection end portion 15A at which current crowding occurs, whereby current non-uniformity is mitigated. Specifically, when the contact area is reduced in the connection end portion 15A, the resistance between the semiconductor and the wiring electrode is increased, therefore making it possible to harmonize the current distribution in the direction in which the wiring electrode 15 is stretched. FIG. 7 shows results of simulations performed on the electrode structure E1. The vertical axis represents current, non-uniformity (%). For the horizontal axis, the contact width D1 at the connection end portion 15A, and the contact width D2 at the terminal end portion 15B, of the wiring electrode 15 are denoted in the format "D1-D2." The simulations were performed with the width of the wiring electrode 15 being constant (i.e., W1−W2=W) at W=10 μm.

The simulation results are for instances in which the contact resistance is $1\times10^{-3}$, $5\times10^{-4}$, $1\times10^{-4}$, $5\times10^{-5}$, and $1\times10^{-5}$ $\Omega cm^2$.

Figure 8:
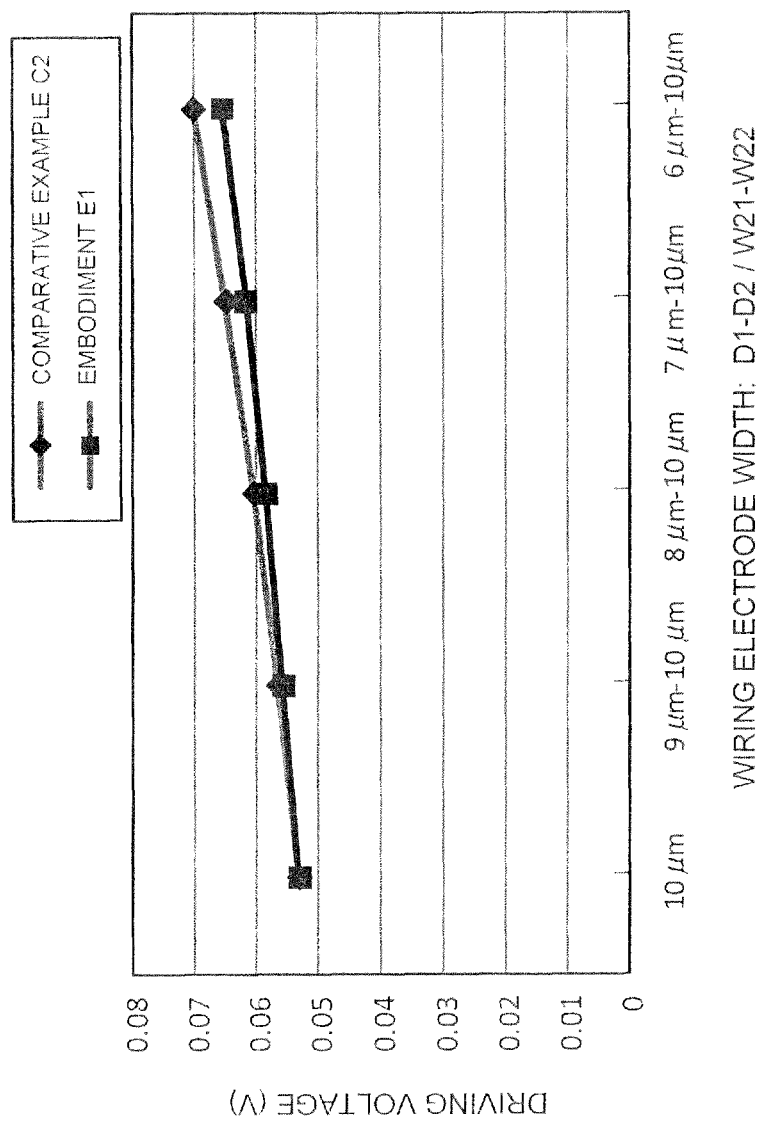
FIG. 8 is a graph in which the driving voltages of the electrode structure E1 and the electrode structure C2 are compared.

As shown in FIG. 7, it can be seen that even for an instance in which the contact resistance is $1\times10^{-5}$ $\Omega cm^2$, for which current non-uniformity could not be resolved in the electrode structure C2 of the comparative example 2, it is possible to mitigate the current non-uniformity down to 10% when the electrode structure E1 is used. Therefore, a uniform current distribution can be obtained, particularly in an instance in which the contact resistance is equal to or less than $1\times10^{-5}$ $\Omega cm^2$. FIG. 8 is a graph in which the driving voltages of the electrode structure E1 and the electrode structure C2 are compared. The vertical axis represents voltage. The horizontal axis represents the contact width D1 at the connection end portion 15A and the contact width D2 at the terminal end portion 15B (in the format "D1-D2") in the instance of the electrode structure E1, and represents the wiring electrode width at the connection end portion and the wiring electrode width at the terminal end portion (in the format "W21-W22") in the instance of the electrode structure C2. As shown in FIG. 8, it can be seen that the voltage is lower in the electrode structure E1 than in the electrode structure C2. Also, in the electrode structure E1, the contact area between the wiring electrode and the semiconductor is modified without the width (W) of the wiring electrode itself being changed. Therefore, narrowing the contact width D1 at the connection end portion 15A which is the connection portion with the pad electrode 14 does not result in a problem of the wiring electrode peeling or breaking.

Second Embodiment

Figure 9A:
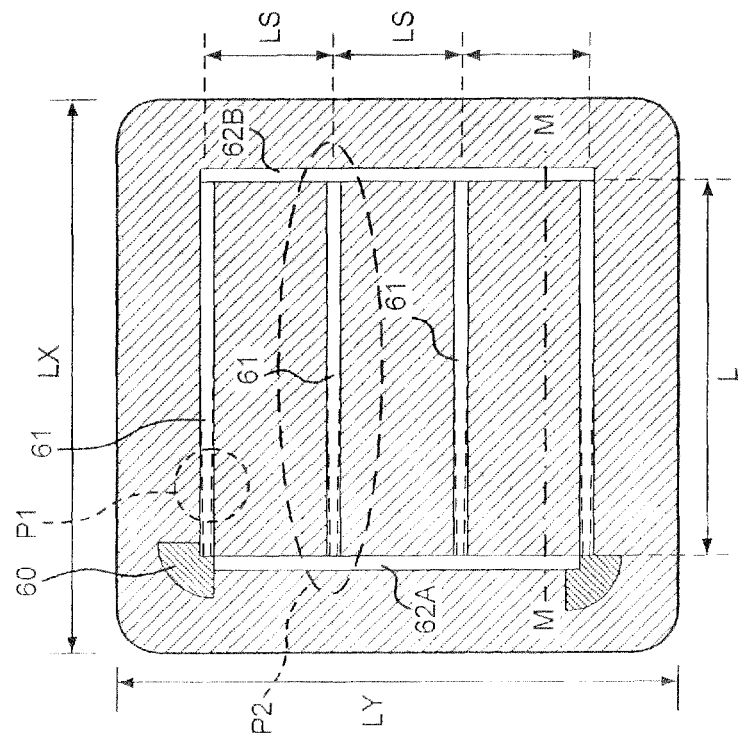
FIGS. 9A and 9B are a top view of the electrode structure 12 according to a second embodiment of the invention, and a partial cross-section view of an LED having the electrode structure E2, respectively.
Figure 9B:
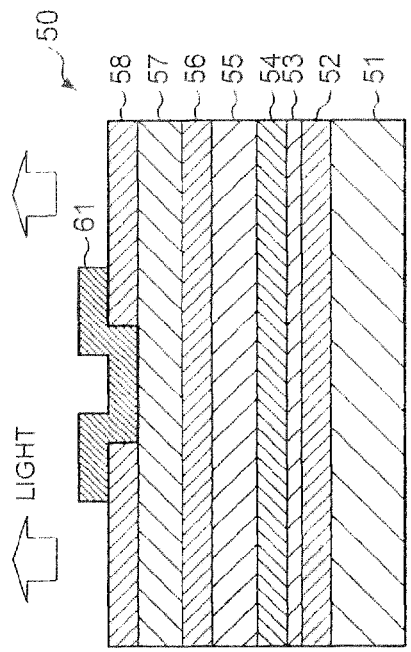

FIGS. 9A and B are a top view of an electrode structure (hereafter also referred to as "E2") according to a second embodiment of the invention and a partial cross-section views of an LED 50 having the electrode structure E2. FIG. 9B schematically illustrates the cross-section of a portion (i.e., region P1 indicated by a dashed line) of FIG. 9A. As shown in FIG. 9B, the LED 50 is formed by forming a semiconductor layered body comprising AlGaInP-based semiconductor layers on a C-plane sapphire or another growth substrate using e.g., metal-organic chemical vapour deposition (MOCVD); then bonding the semiconductor layered body with an Si or another support substrate; interposed by a bonding layer; and removing the growth substrate using laser-lift-off (LLO) or another method. In more detail, the LED 50 comprises a support substrate 51, a bonding layer 52, a light-reflecting film 53, a transparent electrode layer (p-electrode) 54, a p-type semiconductor layer 55, a light-emitting layer 56, an n-type semiconductor layer 57, an insulating film 58, and an n-electrode (i.e., wiring electrode) 61 (having a polarity opposite to that of the transparent electrode layer 54). The surface of the LED 50, i.e., the surface of the n-type semiconductor layer 57 corresponds to the light extraction surface. The insulating film 56 is termed from a material that is light-transmissive or transparent with respect to light radiated from the light-emitting layer 56.

The configuration described above is merely an example of the LED 50, and the electrode structures according to the present invention can be applied to an LED having a semiconductor layer having a variety of configurations. For example, the semiconductor layered body comprising the p-type semiconductor layer 55, the light-emitting layer 56, and the n-type semiconductor layer 57 may further include a current-spreading layer, a clad layer, and a contact layer. The conductivity type (n-type, p-type) of the seam conductor layers and the polarity (n, p) of the electrodes may be opposite to those described above.

As shown in FIG. 9A, the surface of the LED 50 has formed thereon an n-electrode comprising two pad electrodes 60 supplied with a current from an external circuit; and a second wiring electrode 62A, a third wiring electrode 62B, and four first wiring electrodes 61 arranged parallel to each other. In more detail, the two pad electrodes 60 are connected to each other by the second wiring electrode 62A. The second wiring electrode 62A also serves as a connection electrode for establishing a connection to an external circuit, with an element driving voltage being applied to, and current injection being performed on, the second wiring electrode 62A. One end of each of the first wiring electrodes 61 is connected to the second wiring electrode 62A, and the corresponding connection end serves as a connection end portion which connects to the abovementioned connection electrode. The terminal end portion of each of the first wiring electrodes 61 is connected to the third wiring electrode 62B.

FIG. 10A is a plan view illustrating, in expansion, the portion of FIG. 9A representing a first wiring electrodes 61 (i.e., region P2 indicated by a dashed line). The first wiring electrode 61 is in contact, at the connection end portion 61A at which a connection is established with the second wiring electrode 61A, with the n-type semiconductor layer 57 at a width D1 that is smaller than the width W of the first wiring electrode 61 (D1<W). In more detail, as shown in FIG. 10A, the first wiring electrode 61 (length L) comprises: a first electrode portion 61P1 which is connected to the second wiring electrode 62A and which stretches from ten connection end portion 61A; and a second electrode portion 61P2 which further stretches from the first electrode portion 61P1. FIGS. 10B and 10C are cross-section views schematically illustrating the cross-section of the first electrode portion 61P1 and the second electrode portion 61P2 along lines V1-V1 and V2-V2, respectively. In FIG. 10A, a contact region 61K between the first wiring electrode 61 and the semiconductor layer 11 is indicated by hatching using dashed lines. In the first electrode portion 61P1 (length LA), the contact width D between the first wiring electrode 61 and the n-type semiconductor layer 57 increases in the direction in which the first wiring electrode 61 is stretched from the connection end portion 61A. In the second electrode portion 61P2 (length LB=L–LA), the width W of the wiring electrode 61 and the contact width D are identical (D=W). The width W of the wiring electrode 61 may also be greater than the contact width D in its entire region, i.e., cross the first electrode portion 61P1 and the second electrode portion 61P2.

[Element Fabrication]

Elements having a structure shown in FIGS. 9A and B were fabricated, and the characteristics of the elements were evaluated. With regards to the LED 50, a semiconductor layered body comprising AlGaInP-based semiconductor layers was formed on a C-plane sapphire growth substrate using MOCVD. More specifically, an n-type semiconductor layer 57, a light-emitting layer 56, and a p-type semiconductor layer 55 were sequentially grown on the growth substrate, and a semiconductor layered body was formed. The LED 50 was fabricated using an epiwafer in which the semiconductor layered body was formed.

First, the p-type semiconductor layer 55 was activated by heat treatment in an inert gas atmosphere; then, an indium, tin oxide (ITO) layer (layer thickness: 20 nm) was formed on the semiconductor layer surface. Next, the ITO layer was photolithographically imparted with a desired pattern, and the transparent electrode layer (or p-electrode) 54 was formed on a part of the p-type semiconductor layer 55. Then, after photoresist removal, the ITO layer was subjected to heat treatment at a temperature of 400° C. to 700° C. in an atmosphere containing oxygen. In order to reflect light radiated towards the p-type semiconductor layer 55 back towards the surface of the n-type semiconductor layer 57, which is the light radiating surface, there was formed a light-reflecting film 53 comprising a metal layer having a high reflectivity with respect to the emission wavelength. The light-reflecting film 53 can be formed from a single-layer film made of Ag, Al, Rh, Pd, or another element; or from a layered film comprising an alloy of the aforementioned elements or a configuration in which one or more of the aforementioned elements are layered, interposed by Ti or Ni. With regards to the outermost layer of the light-reflecting film, Au was used in order to improve adhesion in relation to the bonding layer provided on the support substrate 51. The thickness of the light-reflecting film is preferably equal to or greater than 100 nm. If the thickness is any less, sufficient light-reflecting performance cannot be obtained.

The LED 50 is an optical semiconductor element with a vertical power supply, and has a structure obtained by removing a growth substrate; and is therefore formed so as to be bonded to an electroconductive support substrate. Si or SiC can be used for the electroconductive support substrate 51. One surface of the support substrate 51 has formed thereon a bonding layer for bonding the semiconductor element, in which the transparent electrode layer 54 and the light-reflecting film 53 are formed on the semiconductor layer grown on the growth substrate. A AuSn layer was used as the bonding layer. The AuSn layer preferably has a thickness of 1 to 2 μm. The bonding layer is not limited to that comprising AuSn. AuSn-bonding between the semiconductor element on the growth-substrate and the support-substrate 51 side was performed by applying pressure under heating using a wafer bonder and forming a eutectic AuSn alloy at the bonding interface, next, the growth substrate was removed using laser lift-off (LLO), in which a high-output pulsed laser beam is directed from the reverse surface of the growth substrate on which the semiconductor layer is not grown.

Next, a $SiO_2$ film having a thickness of 350 nm was deposited by sputtering, and openings were formed by photolithography in the $SiO_2$ film to form an insulating film 58, the openings serve as contact regions between the wiring electrode and she n-type semiconductor layer 57. Ti having a thickness of approximately 1 nm and Al having a thickness of approximately 1000 nm were sequentially formed on the insulating film 58 using electron beam (EB) deposition, and the wiring electrodes 61, 62A, 62B, and the pad electrodes 60 vie re formed by photolithography. The pad electrodes were plated with Au (gold) so that Au wire bonding can be performed. By forming the insulating film 58 and the wiring electrodes 61, 62A, 62B, and the pad electrodes 60, an electrode structure E2 having a structure shown in FIGS. 9A and 9B and FIGS. 10A to 10C was formed. The length L of the first wiring electrodes 61 was set to 735 μm, and the lengths LA, LB of the first and second electrode portions 61P1, 61P2 were set to 370 μm and 365 μm, respectively. The width W of the first wiring electrodes 61 was set to 10 μm, the contact width D1 of the first wiring electrodes 61 at the connection end portion 61A was sec to 8 μm; and the contact width D of the first wiring electrodes 61 was configured so as to increase linearly in the direction in which the first wiring electrodes 61 are stretched. The element measured 1000 μm horizontally (LX) and 1170 nm vertically (LY), and the spacing between the first wiring electrodes 61 (LS) was set to 245 μm.

An LED having the electrode structure C1 of the comparative example 1 (hereafter also referred to as "LED (comparative example)") was also produced in order to perform a comparative evaluation of current distribution characteristics with the LED 50 having the electrode structure 22 according to the second embodiment (hereafter also referred to as "LED (embodiment)"). Specifically, the configuration of the LED (comparative example) is identical to the LED (embodiment) except that the first wiring electrode 61 in the electrode structure E2 has been replaced by the electrode structure C1 of the comparative example 1.

[Element Evaluation Results]

Figure 11:
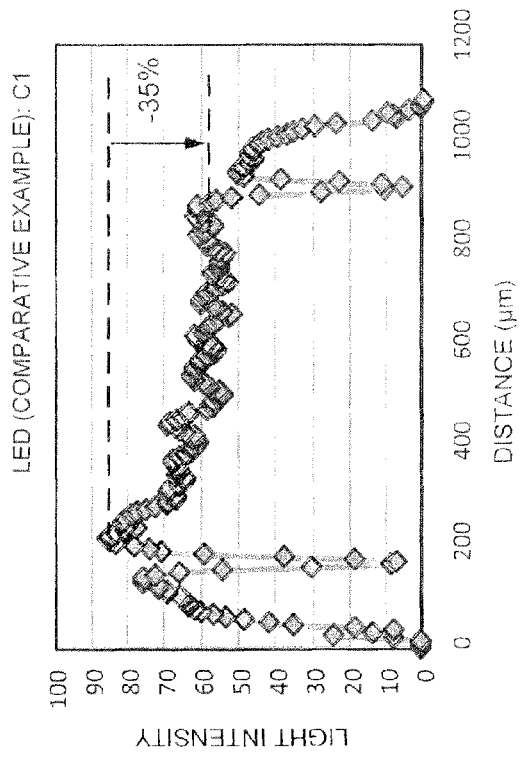
FIG. 11 shows results obtained when a driving current is passed in an LED (embodiment) having the electrode structure according to the second embodiment and the light intensity distribution is measured.
Figure 12:
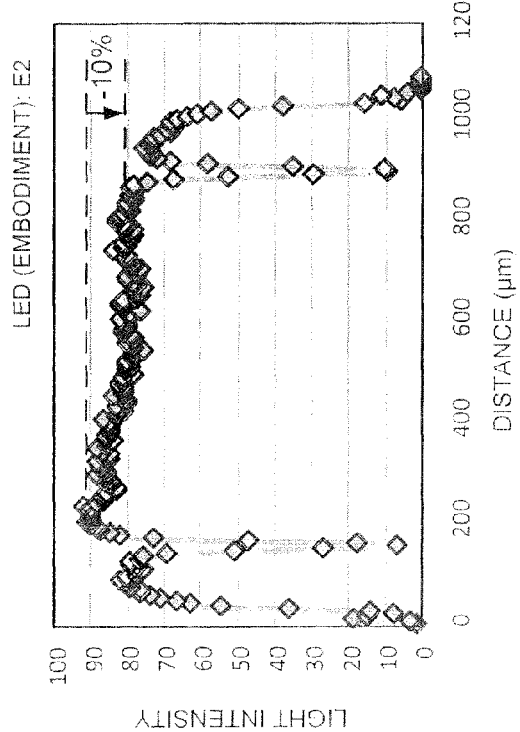
FIG. 12 shows results obtained when a driving current is passed in an LED (embodiment) having the electrode structure of the comparative example 1 and the light intensity distribution is measured.

FIGS. 11 and 12 respectively show results obtained by passing a driving current in the abovementioned LED (embodiment) and LED (comparative example) and measuring the light intensity distribution from the surface of the LED 50, which is the light-extraction surface, i.e., the surface on which the insulating film 58 and the electrode structure E2 are formed (FIG. 9A). Specifically, the light intensify distribution was measured along line M-M shown in FIG. 9A, i.e., along the direction in which the wiring electrodes in the electrode structure E2 and the electrode structure C1 are stretched. The elements were driven using a current value such that the measured light intensity distribution is proportional to tire current distribution. The dips in light intensity in FIGS. 11 and 12 were caused by the wiring electrodes 62A and 62B blocking the light, emission from the light-emitting layer.

As shown in FIG. 11, the non-uniformity of the light, intensity distribution was kept to 10% or less in the LED (embodiment). In contrast, as shown in FIG. 12, a large non-uniformity of 35% was observed in the light intensity distribution in the LED (comparative example). From these results, it was confirmed that the electrode structure of the present invention described above makes it possible to provide an electrode in which current crowding or concentration is absent along the direction in which the wiring electrode is stretched or extending, and in which a uniform current distribution can be obtained. Therefore, according to the electrode structure of the present invention, it is possible to provide a semiconductor light-emitting element that enables uniform spreading and injection of current in the light-emitting layer, and that has a high brightness and a high light-emission efficiency. Also, the element-driving voltage is prevented from rising, and the wiring electrode adheres well. Another benefit is that patterning of the wiring electrode can be readily performed.

Third Embodiment

In the abovementioned first and second embodiments, descriptions were given for instances in which the width of the contact region in which the wiring electrode is in contact with the semiconductor layer increases from the connecting portion with the connection electrode (e.g., pad electrode) along the direction in which the wiring electrode is stretched; however, this is not provided by way of limitation. It is only necessary that a configuration is present in which the contact area of the wiring electrode increases in an equivalent manner along the direction in which the wiring electrode is stretched without the width of the wiring electrode being reduced.

FIG. 13A is a top view schematically illustrating an electrode structure, according to a third embodiment of the present invention (hereafter also referred to as "electrode structure; E3"), representing an example of a wiring electrode configured so that the contact area increases in an equivalent manner. FIGS. 13B and C are cross-section views schematically illustrating cross-sections along lines V1-V1 and V2-V2 in FIG. 13A respectively. In more detail, an insulation layer 12 is formed on the semiconductor layer 11, and the insulation layer 12 has formed thereon a wiring electrode 71 which is electrically connected to the pad electrode 14. The wiring electrode 71 stretches from a connecting portion with the pad electrode 14; and as shown in FIGS. 13A to C, has a uniform width W in a direction perpendicular to the direction in which the wiring electrode 71 stretches. Openings are formed in the insulation layer 12. In the openings, the wiring electrode 71 as in contact with the semiconductor layer 11, and contact regions CR(1) through CR(4) are formed. In the regions between the contact regions CR(1) through CR(4), the wiring electrode 71 is formed on the insulation layer 12, and the wiring electrode 71 is electrically isolated from the semiconductor layer 11 by non-contact regions IR(1) through IR(3) in which the wiring electrode 71 is not in contact with the semiconductor layer 11. The contact regions CR(1) through CR(4) and the non-contact regions IR(1) through IR(3) have an identical width W in a direction perpendicular to the direction in which the wiring electrode 71 stretches.

The lengths of the contact regions CR(1) through CR(4), i.e., the lengths in the direction in which the wiring electrode 71 stretches, sequentially increase from, a connection end portion 71A which is a connection portion with the pad electrode 14 in the direction in which the wiring electrode 71 stretches according to the relationship LC(1)<LC(2)<LC(3)<LC(4). In other words, the area of the contact regions CR(1) through CR(4) sequentially increases in the direction in which the wiring electrode 71 stretches. FIG. 13 illustrates an example in which the area of the non-contact regions IR(1) through IR(3) also sequentially increases in the direction in which the wiring electrode 71 stretches (i.e., LI(1)<LI(2)<LI(3)); however, this is not provided by way of limitation, and the area of the non-contact regions may be identical to each other. Also, she proportion of the area of the contact regions may progressively increase, in relation to the area of the non-contact regions, further along the stretching direction. An arrangement is possible in which the area of a non-contact region is larger than the area of an adjacent contact region in the vicinity of the electrode pad, and the area of a contact region is larger than the area of an adjacent non-contact region in a section further from the electrode pad.

The example above is not provided by way of limitation; what is required is that a configuration is present in which the contact area of the wiring electrode varies so as to increase along the direction in which the wiring electrode stretches. Specifically, what is required is that a configuration is present in which the lengths of the widths of the contact regions CR(1) through CR(4) sequentially increase in the direction in which the wiring electrode 71 stretches, or the lengths or the widths of the non-contact regions IR(1) through IR(3) are adjusted along the direction in which the wiring electrode 71 stretches, whereby the areas of the contact regions CR(1) through CR(4) vary so as to sequentially increase along the direction in which the wiring electrode stretches. The number of the contact regions is not limited that described above; the number (N) can be set as appropriate as expressed by CR (j) (j=1, 2, . . . , N). As another example of modification, it is possible to adopt a configuration in which the first and second embodiments are combined, the length and the width of each of the contact regions CR(j) being varied so that the contact area of the wiring electrode increases along the direction in which the wiring electrode stretches. The number, arrangement configuration, direction of stretching, and other parameters regarding the wiring electrode may be set as appropriate according to the desired direction along which current uniformity is to be obtained, or the size or the shape of the regions.

In the abovementioned embodiments, descriptions were given for examples in which the widths of the wiring electrodes 15, 61, 71 are uniform or constant; however, the widths are not required to be uniform. The present invention is characterized in that the contact area increases along the direction in which the wiring electrode stretches, and has an area change or area modulation that, is different to that of the wiring electrode along the direction in which the wiring electrode stretches. What is required is that the wiring electrode has a width such that current crowding does not occur and adhesion of the wiring electrode is sufficient, and the width of the wiring electrode along the direction in which the wiring electrode stretches is designed according to the degree of increase in the contact area along the direction in which the wiring electrode stretches.

As described in detail above, according to the electrode structure of the present invention, it is possible to obtain a uniform current distribution in which current crowding or concentration is absent along the direction in which the wiring electrode stretches. Therefore, providing the electrode structure makes it possible to obtain a semiconductor light-emitting element in which a current, can be injected into the light-emitting layer in a uniform manner and in which the semiconductor light-emitting element has a high brightness and a high light emission efficiency. Also, the element-driving voltage is prevented from rising, and the wiring electrode adheres well. Another benefit is obtained in that patterning of the wiring electrode can be readily formed.

The abovementioned embodiments and modification examples can be combined or changed as appropriate upon application. The abovementioned semiconductor composition, material, values, and other parameters are merely examples.

This application is based on Japanese Patent Application No. 2011-279770 which is hereby incorporated by reference.

What is claimed is:
1. A semiconductor light-emitting element comprising:
  a semiconductor layered body including a light-emitting layer;
  an insulation layer provided on a light extraction surface of said semiconductor layered body; and
  an electrode structural body provided on said insulation layer;
  wherein said electrode structural body includes:
    a connection electrode for receiving an external current supply; and
    a wiring electrode connected to said connection electrode, the wiring electrode stretching along a surface of said semiconductor layered body while being in partial contact with the light extraction surface of said semiconductor layered body exposed from an opening formed in said insulation layer;
  wherein an area of a contact region between said wiring electrode and said semiconductor layered body increases, from a connection end at which said wiring electrode is connected to said connection electrode, along a direction in which the wiring electrode stretches; and
  wherein an area of a non-contact region of the wiring electrode decreases from the connection end along the direction in which the wiring electrode stretches, the non-contact region being a region between said wiring electrode and said insulation layer.

2. The semiconductor light-emitting element according to claim 1, wherein a width of said contact region is smaller than a width of said wiring electrode at the connection end, and the width of said contact region increases along the direction in which said wiring electrode stretches.

3. The semiconductor light-emitting element according to claim 2, wherein the width of said contact region increases in a linear manner along the direction in which said wiring electrode stretches.

4. The semiconductor light-emitting element according to claim 1, wherein said wiring electrode has a uniform width in a direction perpendicular to the direction in which said wiring electrode stretches.

5. The semiconductor light-emitting element according to claim 1, wherein a contact resistance between said wiring electrode and said semiconductor layered body is equal to or less than $1 \times 10^{-5} \, \Omega cm^2$.

6. The semiconductor light-emitting element according to claim 1, wherein said wiring electrode comprises:

a first electrode portion stretching from the connection end at which said wiring electrode is connected to said connection electrode; and a second electrode portion further stretching from said first electrode portion;

wherein the area of the contact region between said first electrode portion and said semiconductor layered body increases from the connection end along the direction in which said first electrode portion stretches; and wherein a width of said second electrode portion is constant along the direction in which said first electrode portion stretches.

7. The semiconductor light-emitting element according to claim 1, wherein said electrode structural body comprises a plurality of said wiring electrodes.

8. The semiconductor light-emitting element according to claim 1, further comprising an electrode having a polarity opposite to that of said electrode structural body and provided on a surface of said semiconductor layered body opposite to the light extraction surface.

* * * * *